(12) United States Patent
Lee et al.

(10) Patent No.: US 11,127,795 B2
(45) Date of Patent: Sep. 21, 2021

(54) OPTICAL UNIT AND ORGANIC LIGHT EMITTING DISPLAY INCLUDING THE SAME

(71) Applicant: SAMSUNG DISPLAY CO., LTD., Yongin-si (KR)

(72) Inventors: Hee Young Lee, Suwon-si (KR); Hyeon Jeong Sang, Bucheon-si (KR); Suk Choi, Hwaseong-si (KR); Hee Seop Kim, Hwaseong-si (KR); Seung Beom Park, Yongin-si (KR); Yun Jang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 260 days.

(21) Appl. No.: 14/936,581

(22) Filed: Nov. 9, 2015

(65) Prior Publication Data

US 2016/0285051 A1 Sep. 29, 2016

(30) Foreign Application Priority Data

Mar. 25, 2015 (KR) ........................ 10-2015-0041809

(51) Int. Cl.
*H01L 27/32* (2006.01)
*G02B 5/20* (2006.01)
(Continued)

(52) U.S. Cl.
CPC ............ *H01L 27/323* (2013.01); *G02B 5/208* (2013.01); *G02B 5/3083* (2013.01);
(Continued)

(58) Field of Classification Search
CPC .... G02B 5/3016; G02B 5/3083; G02B 5/208; G02B 27/26; G02B 27/286;
(Continued)

(56) References Cited

U.S. PATENT DOCUMENTS 4,842,376 A * 6/1989 Braatz ................... G02F 1/1354
257/449
6,025,958 A * 2/2000 Yamaoka ............. G02B 5/3083
349/5

(Continued)

FOREIGN PATENT DOCUMENTS

CN 101346217 A 1/2009
CN 104297993 A 1/2015
(Continued)

*Primary Examiner* — Eric R Smith
(74) *Attorney, Agent, or Firm* — Lewis Roca Rothgerber Christie LLP

(57) ABSTRACT

An optical unit of embodiments of the present disclosure includes a phase difference layer including a UV absorbent, and a linear polarization layer on the phase difference layer. The phase difference layer may further includes a base film, a liquid crystal layer, and an overcoat layer on the liquid crystal layer. The resulting optical unit and the organic light emitting display including the same may have improved polarization characteristics and optical characteristics such as transmittance, and excellent external light anti-reflection characteristics and flexibility.

4 Claims, 6 Drawing Sheets

(51) Int. Cl.
*G02B 5/30* (2006.01)
*G02B 27/28* (2006.01)
*H01L 51/52* (2006.01)

(52) U.S. Cl.
CPC ........ *G02B 27/286* (2013.01); *H01L 27/3232* (2013.01); *H01L 51/5281* (2013.01)

(58) Field of Classification Search
CPC ........ G02F 2001/133543; G02F 2001/133631; G02F 2001/133633; G02F 2001/133635; G02F 2001/133637; G02F 2001/133638; G02F 2201/086; G02F 1/13338; G02F 1/13363; G02F 1/133632; G02F 1/133634; G02F 1/133636
See application file for complete search history.

(56) References Cited

U.S. PATENT DOCUMENTS

| | | | | |
|---|---|---|---|---|
| 6,239,276 | B1* | 5/2001 | Gupta | C07D 251/24 544/213 |
| 6,519,016 | B1* | 2/2003 | Ichihashi | G02B 5/3083 349/117 |
| 2003/0109629 | A1 | 6/2003 | Pierre | C08K 5/3435 524/513 |
| 2004/0051445 | A1* | 3/2004 | Adachi | G02B 5/3016 313/504 |
| 2007/0099026 | A1* | 5/2007 | Lee | H01L 51/504 428/690 |
| 2007/0148371 | A1* | 6/2007 | Kazama | B29C 43/222 428/1.31 |
| 2007/0200976 | A1* | 8/2007 | Kawamoto | G02B 5/3041 349/96 |
| 2007/0224369 | A1* | 9/2007 | Kojima | G02F 1/13378 428/1.2 |
| 2012/0140161 | A1* | 6/2012 | Nimura | G02B 5/208 349/194 |
| 2012/0327336 | A1* | 12/2012 | Jeon | H01L 51/5281 349/102 |
| 2016/0077267 | A1* | 3/2016 | Inagaki | B32B 23/04 359/489.07 |
| 2016/0085100 | A1* | 3/2016 | Toyoshima | H01L 27/323 349/12 |
| 2016/0092005 | A1* | 3/2016 | Toyoshima | H05K 1/0296 345/174 |
| 2016/0355733 | A1* | 12/2016 | Wang | C09K 19/3809 |

FOREIGN PATENT DOCUMENTS

| | | | |
|---|---|---|---|
| GB | 2329900 A * | 4/1999 | ............ C09K 19/38 |
| GB | 2329900 B | 4/1999 | |
| JP | 2012-32480 A | 2/2012 | |
| JP | 2014-178485 A | 9/2014 | |
| KR | 10-2005-0004439 A | 1/2005 | |
| KR | 10-0659577 B1 | 12/2006 | |
| KR | 10-0670902 B1 | 1/2007 | |
| KR | 10-2009-0081338 A | 7/2009 | |
| KR | 10-2009-0115793 A | 11/2009 | |
| KR | 10-2010-0024784 A | 3/2010 | |
| KR | 10-2010-0077799 A | 7/2010 | |
| KR | 10-2011-0075363 A | 7/2011 | |
| KR | 10-2013-0000310 A | 1/2013 | |
| KR | 10-2013-0074667 A | 7/2013 | |
| WO | WO 2011/155616 A1 | 12/2011 | |
| WO | 2014/185001 A1 | 11/2014 | |

* cited by examiner

OPTICAL UNIT AND ORGANIC LIGHT EMITTING DISPLAY INCLUDING THE SAME

CROSS-REFERENCE TO RELATED APPLICATION

This application claims priority to and the benefit of Korean Patent Application No. 10-2015-0041809 filed in the Korean Intellectual Property Office on Mar. 25, 2015, the entire content of which is incorporated herein by reference.

BACKGROUND

1. Field

One or more aspects of embodiments of the present disclosure relate to an optical unit and an organic light emitting display including the same.

2. Description of the Related Art

Non-limiting examples of a flat panel display include an organic light emitting display, a liquid crystal display, a plasma display panel, and the like.

In related art, if external light is reflected or scattered on a display surface of a display device, the image displayed by the device may not be well seen. This is especially true for portable devices such as a mobile phones, PMPs (portable multimedia players), PDAs (personal digital assistants), and laptop computers, since these display devices are commonly used outside the room, where there is abundant external light, and thus often experience problems of reflection and scattering of external light on the display surface of the display device.

Recently, foldable display devices capable of being bent and folded have been developed. The foldable display devices are easy to carry, while having a relatively large-scaled screen. The foldable display devices may be utilized in mobile equipment such as mobile phones, PMPs, PDPs, navigations, UMPC (ultra-mobile PC), electronic books, and/or electronic newspapers, in addition to various other applications such as in TVs and computer monitors.

Such foldable display devices may require an anti-reflection film to be attached, and in order to be able to fold the foldable display device with a smaller curvature radius, the anti-reflection film having a thinner structure is required.

The information disclosed in this Background section is only for enhancement of understanding of the background of the disclosure and therefore it may contain information that does not form the prior art that is already known in this country to a person of ordinary skill in the art.

SUMMARY

One or more aspects of embodiments of the present disclosure are directed to an optical unit and an organic light emitting display having an optical characteristic of minimizing external light reflection. Further, one or more aspects of embodiments of the present disclosure are directed at providing an optical unit and an organic light emitting display having a slim total thickness and improved flexibility.

One or more example embodiments of the present disclosure provide an optical unit including: a phase difference layer including a UV absorbent, and a linear polarization layer on the phase difference layer.

The phase difference layer may further include a base film, a liquid crystal layer, and an overcoat layer on the liquid crystal layer.

The UV absorbent may be on a rear surface of the base film.

The UV absorbent may be on a front surface of the base film.

The base film may include the UV absorbent.

The liquid crystal layer may include the UV absorbent.

The UV absorbent may include at least one selected from compounds represented by any of Chemical Formulae 1 and 2:

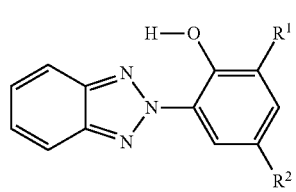

Chemical Formula 1

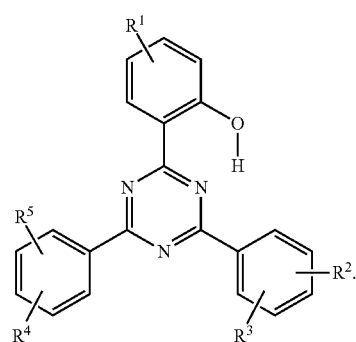

Chemical Formula 2

In Chemical Formulae 1 and 2, $R^1$ to $R^6$ may each independently be a substituent group or a hydrogen atom, where the substituent group is selected from an alkyl group, a cycloalkyl group, an aryl group, an acylamino group, an alkylthio group, an arylthio group, an alkenyl group, a halogen atom, an alkynyl group, a heterocyclic group, an alkylsulfonyl group, an arylsulfonyl group, an alkylsulfinyl group, an arylsulfinyl group, a phosphono group, an acyl group, a carbamoyl group, a sulfamoyl group, a sulfonamide group, a cyano group, an alkoxy group, an aryloxy group, a heterocyclic oxy group, a siloxy group, an acyloxy group, a sulfonic acid group, a sulfonic acid salt, an aminocarbonyloxy group, an amino group, an anilino group, an imide group, a ureide group, an alkoxycarbonylamino group, an alkoxycarbonyl group, an aryloxycarbonyl group, a heterocyclic thio group, a thioureide group, a carboxyl group, a carboxylic acid salt, a hydroxyl group, a mercapto group, and a nitro group.

A compound represented by Chemical Formula 3 may be further included in the UV absorbent:

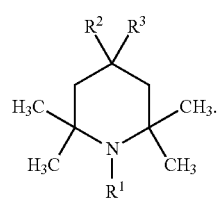

Chemical Formula 3

In Chemical Formula 3, $R^1$ to $R^3$ may each independently be a substituent group or a hydrogen atom, where the substituent group is selected from an alkyl group, a cycloalkyl group, an aryl group, an acylamino group, an alkylthio group, an arylthio group, an alkenyl group, a halogen atom, an alkynyl group, a heterocyclic group, an alkylsulfonyl group, an arylsulfonyl group, an alkylsulfinyl group, an arylsulfinyl group, a phosphono group, an acyl group, a carbamoyl group, a sulfamoyl group, a sulfonamide group, a cyano group, an alkoxy group, an aryloxy group, a heterocyclic oxy group, a siloxy group, an acyloxy group, a sulfonic acid group, a sulfonic acid salt, an aminocarbonyloxy group, an amino group, an anilino group, an imide group, a ureide group, an alkoxycarbonylamino group, an alkoxycarbonyl group, an aryloxycarbonyl group, a heterocyclic thio group, a thioureide group, a carboxyl group, a carboxylic acid salt, a hydroxyl group, a mercapto group, and a nitro group.

One or more example embodiments of the present disclosure provide an organic light emitting display including: an optical unit, and a display panel on a rear surface of the optical unit, where the optical unit includes a phase difference layer including a UV absorbent, and a linear polarization layer on the phase difference layer.

The phase difference layer may include a base film, a liquid crystal layer, and an overcoat layer on the liquid crystal layer.

The UV absorbent may be on a rear surface of the base film.

The UV absorbent may be on a front surface of the base film.

The base film may include the UV absorbent.

The liquid crystal layer may include the UV absorbent.

The UV absorbent may include at least one selected from compounds represented by any of Chemical Formulae 1 and 2:

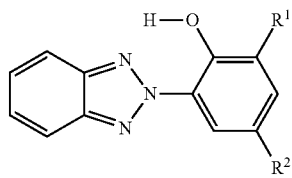

Chemical Formula 1

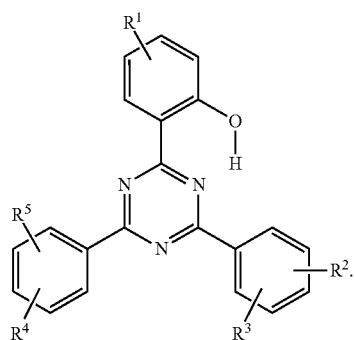

Chemical Formula 2

In Chemical Formulae 1 and 2, $R^1$ to $R^5$ may each independently be a substituent group or a hydrogen atom, where the substituent group is selected from an alkyl group, a cycloalkyl group, an aryl group, an acylamino group, an alkylthio group, an arylthio group, an alkenyl group, a halogen atom, an alkynyl group, a heterocyclic group, an alkylsulfonyl group, an arylsulfonyl group, an alkylsulfinyl group, an arylsulfinyl group, a phosphono group, an acyl group, a carbamoyl group, a sulfamoyl group, a sulfonamide group, a cyano group, an alkoxy group, an aryloxy group, a heterocyclic oxy group, a siloxy group, an acyloxy group, a sulfonic acid group, a sulfonic acid salt, an aminocarbonyloxy group, an amino group, an anilino group, an imide group, a ureide group, an alkoxycarbonylamino group, an alkoxycarbonyl group, an aryloxycarbonyl group, a heterocyclic thio group, a thioureide group, a carboxyl group, a carboxylic acid salt, a hydroxyl group, a mercapto group, and a nitro group.

A compound represented by Chemical Formula 3 may be further included in the UV absorbent:

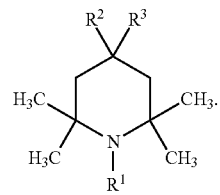

Chemical Formula 3

In Chemical Formula 3, $R^1$ to $R^3$ may each independently be a substituent group or a hydrogen atom, where the substituent group is selected from an alkyl group, a cycloalkyl group, an aryl group, an acylamino group, an alkylthio group, an arylthio group, an alkenyl group, a halogen atom, an alkynyl group, a heterocyclic group, an alkylsulfonyl group, an arylsulfonyl group, an alkylsulfinyl group, an arylsulfinyl group, a phosphono group, an acyl group, a carbamoyl group, a sulfamoyl group, a sulfonamide group, a cyano group, an alkoxy group, an aryloxy group, a heterocyclic oxy group, a siloxy group, an acyloxy group, a sulfonic acid group, a sulfonic acid salt, an aminocarbonyloxy group, an amino group, an anilino group, an imide group, a ureide group, an alkoxycarbonylamino group, an alkoxycarbonyl group, an aryloxycarbonyl group, a heterocyclic thio group, a thioureide group, a carboxyl group, a carboxylic acid salt, a hydroxyl group, a mercapto group, and a nitro group.

The organic light emitting display may further include a touch sensor on a rear surface of the base film.

The phase difference layer may have a λ/4 phase difference value. According to embodiments of the present disclosure, when the optical unit and the organic light emitting display including the optical unit are included in a display device, characteristics of the optical unit may be maintained even when UV light is radiated thereon, and thus the resulting display device may have improved transmittance and degree of polarization. Further, external light reflection through the optical unit may be suppressed or reduced to provide a display device having better display quality. In addition, the optical unit of embodiments of the present disclosure may have reduced total thickness, and thus the resulting display device may have reduced total thickness and improved flexibility.

DETAILED DESCRIPTION OF THE EMBODIMENTS

Figure 1:
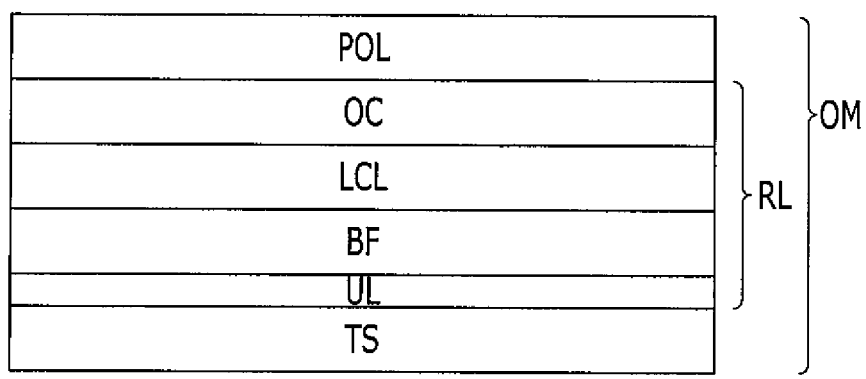
FIG. 1 is a cross-sectional view of an optical unit according to one or more example embodiments of the present disclosure.

Embodiments of the present disclosure will be described more fully hereinafter with reference to the accompanying drawings, in which example embodiments of the disclosure are shown. As those skilled in the art would realize, the described embodiments may be modified in various different ways, all without departing from the spirit or scope of the present disclosure.

Parts that are not necessary to understanding of the present disclosure will be omitted so as to more clearly describe the present disclosure, and the same elements (e.g., diodes) will be designated by the same reference numerals throughout the drawings and specification.

Further, in example embodiments, since like reference numerals designate like elements having the same configuration, once one example embodiment has been representatively described, duplicative descriptions thereof will not be provided again, and other example embodiments will be described only insofar as their configurations differ from the first example embodiment.

In the drawings, the size and thickness of each configuration may be arbitrarily shown for understanding and ease of description, but the present disclosure is not limited thereto. For example, in the drawings, the thickness of layers, films, panels, regions, etc., may be exaggerated for clarity.

It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. Further, in the specification, the word "~on" means positioning on or below the object portion, and is not intended to be limited to a specific orientation. Also, as used herein, the singular forms are intended to include the plural forms as well, and vice versa, unless the context clearly indicates otherwise (e.g., a liquid crystal layer LCL may include a plurality of liquid crystal layers LCL).

Expressions such as "at least one selected from" and "one selected from," when preceding a list of elements, modify the entire list of elements and do not modify the individual elements of the list. Further, the use of "may" when describing embodiments of the present disclosure refers to "one or more embodiments of the present disclosure."

Figure 2:
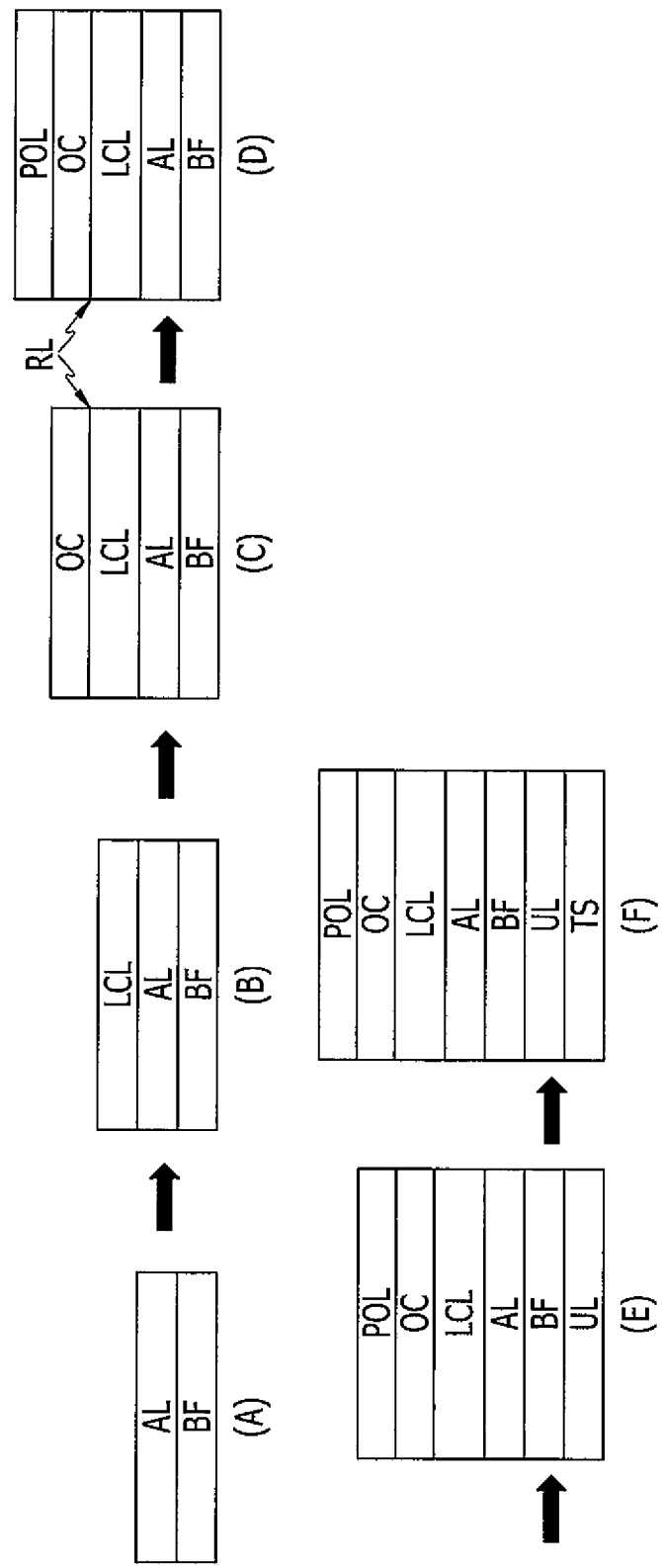
FIG. 2 is a cross-sectional view illustrating a method of manufacturing an optical unit according to one or more example embodiments of the present disclosure.

Hereinafter, a method of manufacturing an optical unit according to one or more example embodiments of the present disclosure will be described with reference to FIGS. 1 and 2. FIG. 1 is a cross-sectional view of the optical unit according to one or more example embodiments of the present disclosure, and FIG. 2 is a cross-sectional view illustrating method steps of manufacturing the optical unit according to the one or more example embodiments of the present disclosure.

Referring to FIG. 1, an optical unit OM includes a touch sensor TS, a phase difference layer RL, and a linear polarization layer POL.

The touch sensor TS may include a sensing portion and a wiring portion. The sensing portion may be positioned to correspond to a display region where organic light emitting diodes of a display unit DM are positioned to display an image, and the wiring portion may be positioned to correspond to a non-display region adjacent to the display region.

The sensing portion may include transparent conductive oxide such as ITO, a conductive polymer material such as a silver nanowire (AgNW) and/or poly(3,4-ethylenedioxythiophene) (PEDOT), a conductive material including carbon such as graphene and/or carbon nanotube CNT, a laminate of the silver nanowire (AgNW) and transparent conductive oxide such as ITO, a laminate of the conductive polymer material such as PEDOT and transparent conductive oxide such as ITO, and/or the like. In some embodiments, the sensing portion may include a bridge, and may include ITO, IZO, Cu, and/or Ag—Pd—Cu-based materials as the bridge. The wiring portion may include the Cu and/or Ag—Pd—Cu-based materials, Ag, and/or the like.

In embodiments where the sensing portion is formed of the silver nanowire (AgNW), the sensing portion may further include an overcoat layer in order to improve a close contacting property. For example, the overcoat layer may be configured to improve the close contacting property of the silver nanowire (AgNW) and the phase difference layer RL.

However, the touch sensor TS is not limited thereto and may be formed in any suitable form generally available in the art of display devices.

In some embodiments, the phase difference layer RL has a $\lambda/4$ phase difference value overall (e.g., the phase difference layer RL may be a quarter-wave plate), and includes a UV absorbent UL, a base film BF positioned on the UV absorbent UL, a liquid crystal layer LCL positioned on the base film BF, and an overcoat layer OC positioned on the liquid crystal layer LCL.

The phase difference layer RL may include the UV absorbent UL positioned on a rear (or bottom) surface of the base film BF. In some embodiments, the UV absorbent UL may be attached to the base film BF in a film form or may be applied on the base film BF and then cured, but the method of forming the UV absorbent UL is not limited thereto.

The UV absorbent UL may absorb UV light radiated on the optical unit OM during a manufacturing process to control an influence of UV light on the liquid crystal layer LCL. Otherwise, when the UV light is radiated on the liquid crystal layer LCL, bonding of liquid crystal molecules and dyes included in the liquid crystal layer LCL may otherwise change to affect device quality.

A material for forming the UV absorbent UL may be any suitable material that can absorb UV light, and may include a benzotriazole compound, for example, a 2-(2'-hydroxyphenyl)-benzotriazole-based compound such as 2-(2'-hydroxy-5'-methylphenyl)benzotriazole, 2-(3',5'-di-tert-butyl-2'-hydroxyphenyl)benzotriazole, 2-(5'-tert-butyl-2'-hydroxyphenyl)benzotriazole, 2-(2-hydroxy-5-(1,1,3,3,tetramethylbutyl)phenyl)benzotrialzole, 2-(3',5'-di-tert-butyl-2'-hydroxyphenyl)-5-benzotriazole, 2-(3'-tert-butyl-2'-hydroxyphenyl-5'-methylphenyl)-5-benzotriazole, 2-(3'-sec-butyl-5'-tert-butyl-2'-hydroxyphenyl)benzotriazole, 2-(2'-hydroxy-4'-octyloxyphenylphenyl)-5-benzotriazole, and/or 2-(3',5'-di-tert-butyl-2'-hydroxyphenyl)benzotriazole; a benzophenone compound such as a 2-hydroxybenzophenone-based compound having a 4-hydroxy, 4-methoxy, 4-octyloxy, 4-decyloxy, 4-dodecyloxy, 4-benzyloxy, 4,2',4'-trihydroxy, and/or 2'-hydroxy-4,4'-dimethoxy functional group; an ester benzoate compound, for example, a compound having a substituted ester benzoate structure such as 4-tert-butyl-phenyl salicylate, phenyl salicylate, octylphenyl salicylate, dibenzoyl resorcinol, bis(4-tert-butyl-benzoyl)resorcinol, benzoyl resorcinol, 2,4-di-tert-butylphenyl-3,5'-di-tert-butyl-4-hydroxybenzoate, hexadecyl 3,5-di-tert-butyl-4-4hydroxy benzoate, octadecyl 3,5-di-tert-butyl-4-hydroxybenzoate, and/or 2-methyl-4,6-di-tert-butylphenyl 3,5-di-tert-butyl-4-hydroxybenzoate; a triazine compound, and/or the like.

In some embodiments, the UV absorbent UL may include at least one selected from compounds represented by the following Chemical Formulae 1 and 2:

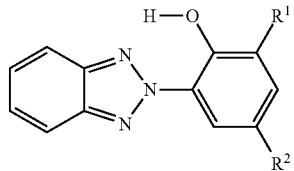

Chemical Formula 1

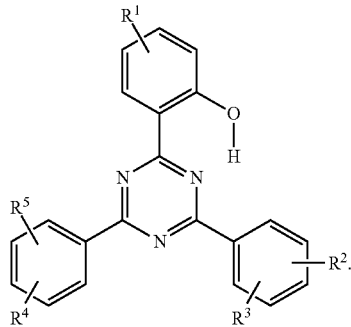

Chemical Formula 2

In Chemical Formulae 1 and 2, $R^1$ to $R^5$ are each independently a substituent group or a hydrogen atom, where the substituent group is selected from an alkyl group, a cycloalkyl group, an aryl group, an acylamino group, an alkylthio group, an arylthio group, an alkenyl group, a halogen atom, an alkynyl group, a heterocyclic group, an alkylsulfonyl group, an arylsulfonyl group, an alkylsulfinyl group, an arylsulfinyl group, a phosphono group, an acyl group, a carbamoyl group, a sulfamoyl group, a sulfonamide group, a cyano group, an alkoxy group, an aryloxy group, a heterocyclic oxy group, a siloxy group, an acyloxy group, a sulfonic acid group, a sulfonic acid salt, an (aminocarbonyl) oxy group, an amino group, an anilino group, an imide group, a ureide group, an alkoxycarbonylamino group, an alkoxycarbonyl group, an aryloxycarbonyl group, a heterocyclic thio group, a thioureide group, a carboxyl group, a carboxylic acid salt, a hydroxyl group, a mercapto group, and a nitro group.

The UV absorbent UL according to one or more example embodiments of the present disclosure may absorb UV light having a wavelength of about 340 nm to about 400 nm.

In some embodiments, the UV absorbent UL may further include a compound represented by the following Chemical Formula 3. The compound represented by the following Chemical Formula 3 may serve as a reaction stabilizer:

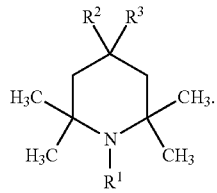

Chemical Formula 3

In Chemical Formula 3, $R^1$ to $R^3$ are each independently a substituent group or a hydrogen atom, where the substituent group is selected from an alkyl group, a cycloalkyl group, an aryl group, an acylamino group, an alkylthio group, an arylthio group, an alkenyl group, a halogen atom, an alkynyl group, a heterocyclic group, an alkylsulfonyl group, an arylsulfonyl group, an alkylsulfinyl group, an arylsulfinyl group, a phosphono group, an acyl group, a carbamoyl group, a sulfamoyl group, a sulfonamide group, a cyano group, an alkoxy group, an aryloxy group, a heterocyclic oxy group, a siloxy group, an acyloxy group, a sulfonic acid group, a sulfonic acid salt, an aminocarbonyloxy group, an amino group, an anilino group, an imide group, a ureide group, an alkoxycarbonylamino group, an alkoxycarbonyl group, an aryloxycarbonyl group, a heterocyclic thio group, a thioureide group, a carboxyl group, a carboxylic acid salt, a hydroxyl group, a mercapto group, and a nitro group.

In some embodiments, the phase difference layer RL may further include an alignment layer positioned between the liquid crystal layer LCL and the base film BF (illustrated in FIG. 2).

The linear polarization layer POL is positioned on the phase difference layer RL. Herein, the linear polarization layer POL may have a film form including polyvinyl alcohol (PVA), a layer form formed by coating, a metal pattern layer form such as a wire grid polarizer WGP, and/or the like. An angle of intersection of an optical axis of the linear polarization layer POL and an optical axis of the phase difference layer RL may be 45°.

In the optical unit OM according to one or more example embodiments of the present disclosure, during the manufacturing of the touch sensor TS, the radiated UV light is absorbed on the UV absorbent UL so as not to affect the liquid crystal layer LCL of the phase difference layer RL, and thus optical characteristics such as transmittance and/or the degree of polarization of the display device including the OM may be improved.

Hereinafter, the method of manufacturing the optical unit OM according to one or more example embodiments of the present disclosure will be described with reference to FIG. 2.

As illustrated in FIGS. 2A and 2B, an alignment layer AL is formed on the base film BF, and then the liquid crystal layer LCL is formed on the alignment layer AL.

In some embodiments, the alignment layer AL may be omitted, and in this case, the liquid crystal layer LCL may be a polymer material layer including a liquid crystal material and a photoresist material.

Subsequently, as illustrated in FIG. 2C, an overcoat layer OC covering the liquid crystal layer LCL is formed, thus manufacturing the phase difference layer RL including the base film BF, the alignment layer AL, the liquid crystal layer LCL, and the overcoat layer OC. As described above, in some embodiments, the alignment layer AL may be omitted.

Herein, the overcoat layer OC may be formed of, but is not limited to, an organic material or an inorganic material, and may serve to protect each of the liquid crystal layers LCL, while concurrently or simultaneously improving adhesion properties of the linear polarization layer POL to be formed on the overcoat layer OC.

Next, as illustrated in FIG. 2D, the linear polarization layer POL is formed on the phase difference layer RL.

For example, the linear polarization layer POL is formed on the overcoat layer OC of the phase difference layer RL. Herein, the linear polarization layer POL may have a film form including PVA, a layer form formed by coating, a metal pattern layer form such as a wire grid polarizer WGP, and/or the like. An angle of intersection of an optical axis of the linear polarization layer POL and an optical axis of the phase difference layer RL may be 45°.

Next, as illustrated in FIG. 2E, the UV absorbent UL may be formed on the rear (or bottom) surface of the base film BF. In this case, the UV absorbent UL may be attached to the base film BF in a film form or may be applied and then cured, but the method of forming the UV absorbent UL is not limited thereto.

While the present specification describes forming the UV absorbent UL on the rear (or bottom) surface of the base film BF after the linear polarization layer POL has been attached, the order in which the UV absorbent UL may be formed on the rear (or bottom) surface of the base film BF is not limited thereto.

According to one or more example embodiments of the present disclosure, the UV absorbent UL positioned on the rear (or bottom) surface of the base film BF may serve as a stopper by, for example, protecting the base film BF during an etching process for forming the touch sensor positioned on the UV absorbent UL and the like.

Next, as illustrated in FIG. 2F, the touch sensor TS positioned on the rear (or bottom) surface of the UV absorbent UL may be formed. The touch sensor TS may include the sensing portion and the wiring portion.

The sensing portion may include a transparent conductive oxide such as ITO, a conductive polymer material such as a silver nanowire (AgNW) and/or PEDOT, a conductive material including carbon such as graphene and/or carbon nanotube CNT, a laminate of the silver nanowire (AgNW) and transparent conductive oxide such as ITO, a laminate of the conductive polymer material such as PEDOT and transparent conductive oxide such as ITO, and/or the like. In some embodiments, the sensing portion may include a bridge, and may include ITO, IZO, Cu, and/or Ag—Pd—Cu-based materials as the bridge.

The wiring portion may include the Cu and/or Ag—Pd—Cu-based materials, Ag, and/or the like. As described above, the touch sensor TS may be formed in any suitable form generally available in the art of display devices.

In embodiments where the sensing portion is formed of the silver nanowire (AgNW) or the like, the sensing portion may further include the overcoat layer in order to improve a close contacting property. For example, the overcoat layer may be configured to improve the close contacting property of the silver nanowire (AgNW) and the phase difference layer RL.

The overcoat layer included in the touch sensor TS may be manufactured by radiating UV light, and the radiated UV light may cure the overcoat layer of the touch sensor TS and may be absorbed by the UV absorbent UL positioned on the touch sensor TS.

In a comparative display device in which the UV absorbent UL is not included, UV light radiated in order to cure the overcoat layer included in the touch sensor TS may change the alignment between a liquid crystal material and a dye positioned in the liquid crystal layer LCL. However, the UV absorbent UL according to example embodiments of the present disclosure prevents or substantially blocks the UV light from reaching the liquid crystal layer LCL.

Therefore, since UV light radiated on the phase difference layer RL does not substantially affect the liquid crystal layer LCL of the phase difference layer RL during the manufacturing process, optical characteristics such as transmittance and degree of polarization of the display device may be improved.

The optical unit formed by the aforementioned process may then be laminated on the display unit including the organic light emitting diode to manufacture the organic light emitting display.

Figure 3:
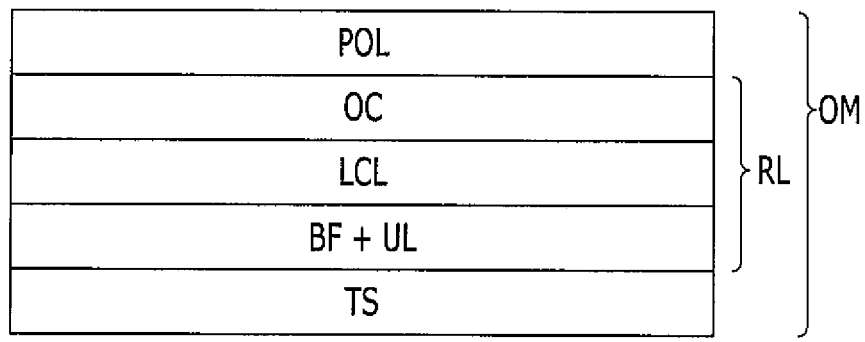
FIGS. 3, 4, and 5 are cross-sectional views of an optical unit according to one or more example embodiments of the present disclosure.
Figure 4:
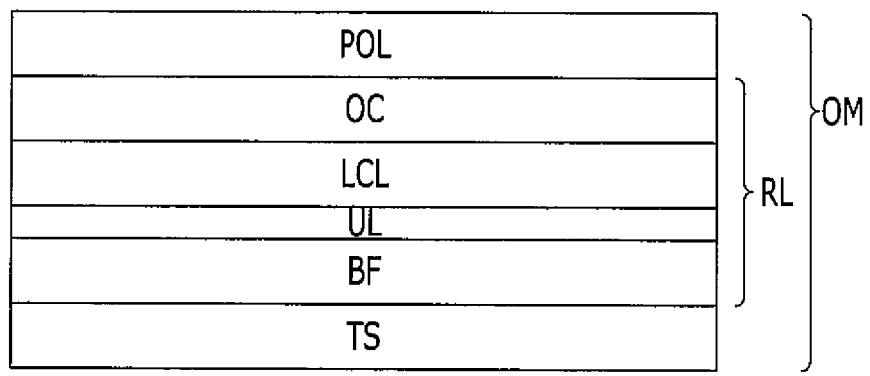
Figure 5:
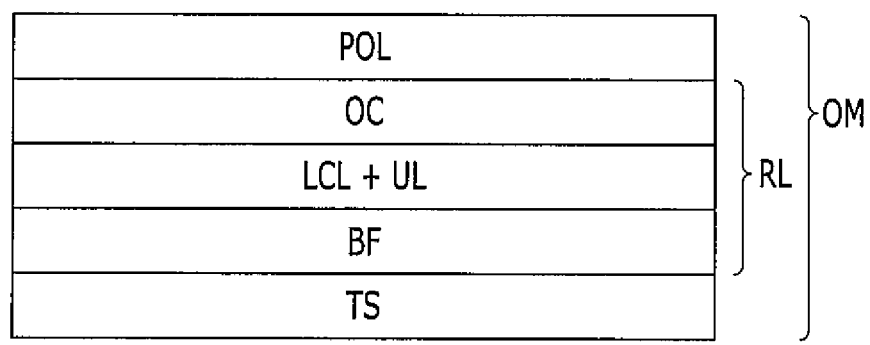

Hereinafter, an optical unit according to one or more further example embodiments of the present disclosure will be described with reference to FIGS. 3 to 5. FIGS. 3, 4, and 5 are cross-sectional views of the optical unit according to one or more further example embodiments of the present disclosure. Here; duplicative descriptions of constituent elements that are the same as or similar to those of the above-described optical unit are not necessary and will not be provided.

Referring to FIG. 3, the optical unit OM according to the present example embodiments may include a UV absorbent UL positioned on a base film BF. Here, the UV absorbent UL may be formed together with the base film during the process of manufacturing the base film BF.

Similar to the above-described UV absorbent UL, the UV absorbent UL of the present example embodiments may be formed of any suitable material that can absorb UV light radiated on the touch sensor TS and may be implemented in a film form.

Next, referring to FIG. 4, in the optical unit OM according to the present example embodiments, the UV absorbent UL may be positioned on the base film BF (e.g., on a front surface of the base film BF). In this case, since the alignment layer may be positioned on the base film BF, the UV absorbent UL may be positioned on the alignment layer.

In the manufacturing process of the present embodiments, since the liquid crystal layer LCL is formed after the UV absorbent UL is formed, the UV absorbent UL utilized in the process has to withstand the process of manufacturing the liquid crystal layer LCL, including, for example, addition of a solvent and formation temperature.

Next, referring to FIG. 5, in the optical unit OM according to one or more further example embodiments of the present disclosure, the UV absorbent UL may be positioned on the liquid crystal layer LCL. In this case, the UV absorbent may be mixed with a liquid crystal material included in the liquid crystal layer LCL.

For example, the optical unit OM according to example embodiments of the present disclosure may include the UV absorbent, where the UV absorbent may be, without limitation, positioned on or beneath the base film BF, positioned to be included in the base film BF, or positioned in the liquid crystal layer LCL.

The overcoat layer included in the touch sensor TS may be formed through radiation of UV light, and the radiated UV light may cure the overcoat layer of the touch sensor TS and then may be absorbed by the UV absorbent UL positioned on the touch sensor TS.

Therefore, during the manufacturing process, the UV light radiated on the phase difference layer RL does not substantially affect the liquid crystal layer LCL of the phase difference layer RL, and thus optical characteristics such as transmittance and the degree of polarization of the display device may be improved.

Figure 6:
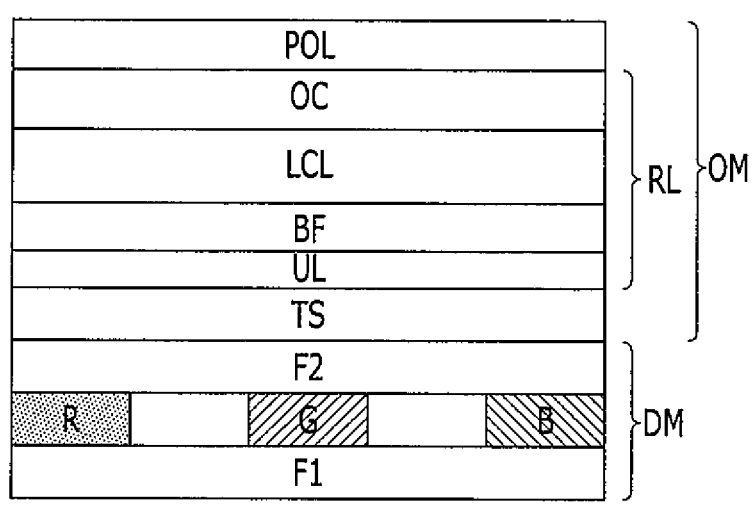
FIG. 6 is a cross-sectional view illustrating an organic light emitting display according to one or more example embodiments of the present disclosure.
Figure 7:
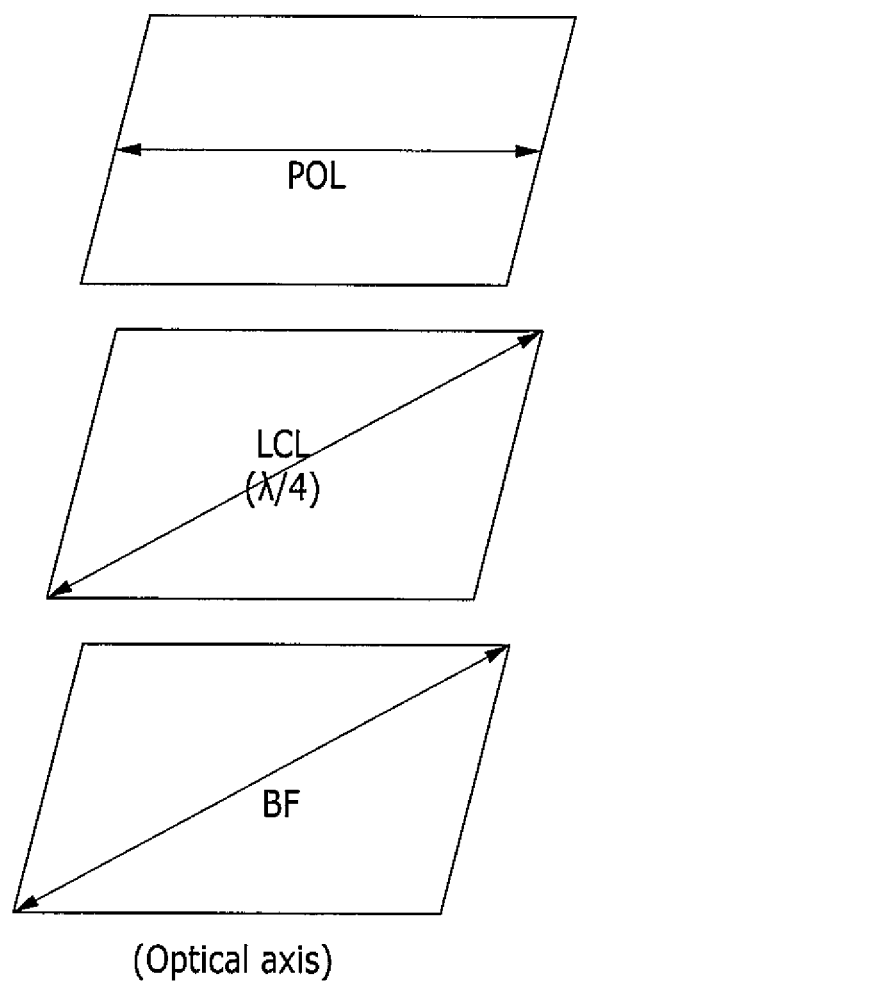
FIG. 7 is a view illustrating optical axes of the phase difference layer and the linear polarization layer illustrated in FIG. 6.
Figure 8:
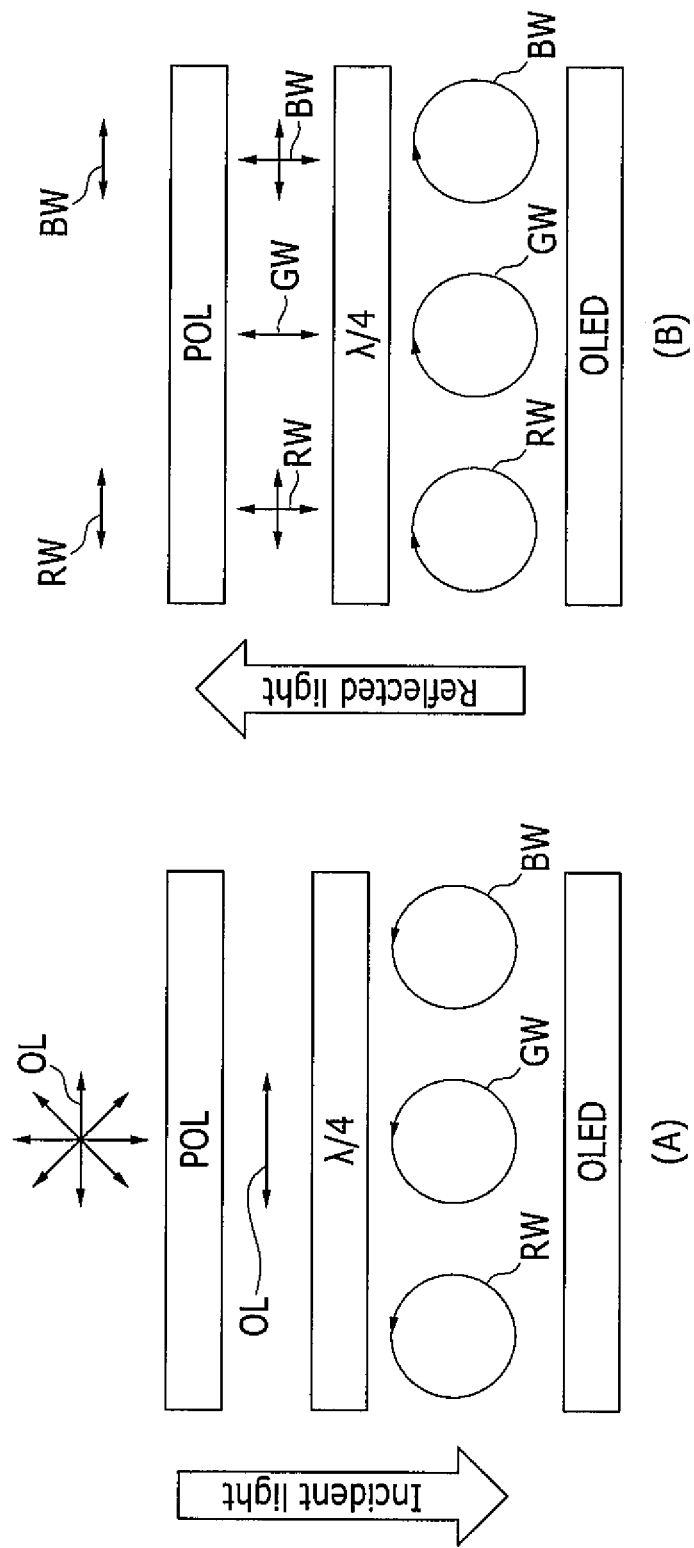
FIG. 8 is a cross-sectional view illustrating external light reflection using a linear polarizing plate and a retarder.

Hereinafter, an organic light emitting display according to one or more example embodiments of the present disclosure will be described with reference to FIGS. 6 to 8. FIG. 6 is a cross-sectional view illustrating the organic light emitting display according to one or more example embodiments of the present disclosure, FIG. 7 is a view illustrating optical axes of the phase difference layer and the linear polarization layer illustrated in FIG. 6, and FIG. 8 is a cross-sectional view illustrating external light reflection using a linear polarizing plate and a retarder.

As illustrated in FIG. 6, an organic light emitting display 1000 according to example embodiments of the present disclosure includes a display unit DM and an optical unit OM. Herein, the display unit DM is the organic light emitting display, and the optical unit OM may be manufactured by the aforementioned method of manufacturing the optical unit according to example embodiments of the present disclosure.

The optical unit OM may be attached to the display unit DM by an adhesive layer such as an OCA (optically clear adhesive) or an attachment layer such as a PSA (pressure sensitive adhesive), but the method of attachment thereof is not limited thereto, and the optical unit OM may be directly formed on the display unit DM by using a MEMS (micro electro mechanical system) including a photolithography process and/or the like.

The display unit DM includes a first substrate F1, a first organic light emitting diode R, a second organic light emitting diode G, a third organic light emitting diode B, and a second substrate F2.

The first substrate F1 may be formed of a glass substrate or a polymer film such as polyimide, and may have a flexible, bendable, rollable, foldable, and/or stretchable characteristic. When the first substrate F1 has the flexible, bendable, rollable, foldable, and/or stretchable characteristic, the entire organic light emitting display 1000 may have the flexible, bendable, rollable, foldable, and/or stretchable characteristic.

On a surface of the first substrate F1, a driver driving each of the first organic light emitting diode R, the second organic light emitting diode G, and the third organic light emitting diode B may be formed. The driver may include a plurality of thin film transistors connected to one or more gate wires, one or more data wires, one organic light emitting diode, and one or more capacitors, but the driver is not limited thereto and may have any suitable configuration generally available in the art.

The first organic light emitting diode R, the second organic light emitting diode G, and the third organic light emitting diode B may each include a first electrode, a second electrode positioned on the first electrode, and an organic light emitting layer positioned between the first electrode and the second electrode, where at least one selected from the first electrode and the second electrode may be formed of a light transmissive electrode, a light semi-transmissive electrode, or a light reflective electrode. In the organic light emitting display 1000 according to example embodiments of the present disclosure, light emitted from each of the first organic light emitting diode R, the second organic light emitting diode G, and the third organic light emitting diode B is outputted in a direction of the optical unit OM in which the linear polarization layer POL is positioned. The first organic light emitting diode R, the second organic light emitting diode G, and the third organic light emitting diode B may be each independently formed in any suitable form generally available in the art.

Although in the above-described example embodiment of the present disclosure, for convenience of description, only three organic light emitting diodes are illustrated, the display device of embodiments of the present disclosure is not limited thereto and may include two or four or more of the organic light emitting diodes, so long as the plurality of organic light emitting diodes may form one image, and each organic light emitting diode may form a pixel that is a minimum unit forming the image.

In some embodiments, the first organic light emitting diode R emits light having a first wavelength, the second organic light emitting diode G emits light having a second wavelength, and the third organic light emitting diode B emits light having a third wavelength. Herein, the wavelength magnitude increases from the third wavelength to the first wavelength, where the first wavelength is larger than each of the second wavelength and the third wavelength, and the second wavelength is larger than the third wavelength. For example, the first organic light emitting diode R may emit red light, the second organic light emitting diode G may emit green light, and the third organic light emitting diode B may emit blue light.

The second substrate F2 may be formed of a glass substrate, a polymer film such as polyimide, or a thin film encapsulation portion, and in the case where the second substrate F2 is formed of the thin film encapsulation portion, one or more organic layers and one or more inorganic layers included in the second substrate F2 may be alternately laminated.

In some embodiments, the optical unit OM of the organic light emitting display 1000 includes a touch sensor TS, a phase difference layer RL, and a linear polarization layer POL.

The touch sensor TS may include a sensing portion and a wiring portion. The sensing portion may be positioned to correspond to a display region where the organic light emitting diodes of the display unit DM are positioned to display an image, and the wiring portion may be positioned to correspond to a non-display region adjacent to the display region.

The sensing portion may include transparent conductive oxide such as ITO, a conductive polymer material such as a silver nanowire (AgNW) and/or PEDOT, a conductive material including carbon such as graphene and/or carbon nanotube CNT, a laminate of the silver nanowire (AgNW) and transparent conductive oxide such as ITO, a laminate of the conductive polymer material such as PEDOT and transparent conductive oxide such as ITO, and/or the like. Further, the sensing portion may include a bridge, and may include ITO, IZO, Cu, and/or Ag—Pd—Cu-based materials as the bridge. The wiring portion may include the Cu and/or Ag—Pd—Cu-based materials, Ag, and/or the like. However, the touch sensor TS is not limited thereto and may be formed in any suitable form generally available in the art of display devices.

In embodiments where the sensing portion is formed of the silver nanowire (AgNW) and/or the like, the sensing portion may further include the overcoat layer in order to improve a close contacting property. For example, the overcoat layer may be configured to improve the close contacting property of the silver nanowire (AgNW) and the phase difference layer RL.

The overcoat layer may be manufactured by radiating UV light, and the radiated UV light may cure the overcoat layer of the touch sensor TS and may be absorbed by a UV absorbent UL positioned on the touch sensor TS.

In some embodiments, the phase difference layer RL has a λ/4 phase difference value overall (e.g., the phase difference layer RL may be a quarter-wave plate), and includes the UV absorbent UL, a base film BF positioned on the UV absorbent UL, a liquid crystal layer LCL positioned on the base film BF, and an overcoat layer OC positioned on the liquid crystal layer LCL.

Although the organic light emitting display 1000 including the optical unit OM has been illustrated in FIGS. 1 and 6, example embodiments of the present disclosure are not limited thereto, and the organic light emitting display may include the optical unit OM according to any of the above-described example embodiments of the present disclosure.

In some embodiments, the phase difference layer RL may further include an alignment layer positioned between the liquid crystal layer LCL and the base film BF, but is not limited thereto.

FIG. 7 is a view illustrating optical axes of the phase difference layer and the linear polarization layer illustrated in FIG. 6.

As illustrated in FIG. 7, the optical axes of the base film BF and the liquid crystal layer LCL each form an angle of intersection of 45° with the optical axis of the linear polarization layer POL, and accordingly, the optical axis of the phase difference layer RL forms an angle of intersection of 45° with the optical axis of the linear polarization layer POL, thereby suppressing (or substantially suppressing) external light reflection. Further, when the base film BF has a thickness of 10 nm or less, the occurrence of retardation in the light transmitted through the base film BF may be suppressed or reduced.

Hereinafter, a principle by which external light reflection can be substantially suppressed or reduced using the linear polarizing plate and the retarder of the present embodiments will be described with reference to FIG. 8.

As illustrated in FIG. 8A, when external light OL passes through the linear polarization layer POL, light that is incident on the linear polarization layer POL in a direction that is not identical (e.g., parallel or substantially parallel) to the linear polarization axis of the linear polarization layer POL is absorbed by the linear polarization layer POL, and thus external light OL becomes linearly polarized while passing through the linear polarization layer POL.

Then, the linearly polarized external light OL may be circularly polarized while passing through a λ/4 retarder to provide light RW having a red wavelength (e.g., a wavelength corresponding to a red light), light GW having a green wavelength (e.g., a wavelength corresponding to a green light), and light BW having a blue wavelength (e.g., a wavelength corresponding to a blue light).

Next, referring now to FIG. 8B, light RW having a red wavelength, light GW having a green wavelength, and light BW having a blue wavelength are reflected on the organic light emitting diode OLED, light RW having the red wavelength, light GW having the green wavelength, and light BW having the blue wavelength are each retarded by 180° and linearly polarized while passing through the λ/4 retarder again (e.g., two times) and are absorbed by the linear polarization layer POL.

To summarize, even though UV light is radiated to manufacture the touch sensor TS, the optical unit according to the example embodiments of the present disclosure may minimize or reduce an influence of UV light on the liquid crystal layer through the UV absorbent included in the phase difference layer.

Accordingly, in the optical unit according to one or more example embodiments of the present disclosure and the organic light emitting display including the same, polarization characteristics and optical characteristics such as transmittance may be improved. Further, the optical unit according to one or more example embodiments of the present disclosure and the organic light emitting display including the same may have excellent external light anti-reflection characteristics and flexibility.

While this disclosure has been described in connection with what is presently considered to be practical example embodiments, it is to be easily understood by those skilled in the art that the disclosure is not limited to the disclosed embodiments, but, on the contrary, is intended to cover various modifications and equivalent arrangements included within the spirit and scope of the appended claims and equivalents thereof.

As used herein, the terms "use," "using," and "used" may be considered synonymous with the terms "utilize," "utilizing," and "utilized," respectively. Also, the terms "substantially," "about," and similar terms are used as terms of approximation and not as terms of degree, and are intended to account for the inherent deviations in measured or calculated values that would be recognized by those of ordinary skill in the art.

In addition, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a), and 35 U.S.C. § 132(a).

DESCRIPTION OF SOME OF THE SYMBOLS

Display unit: DM
Phase difference layer: RL
Linear polarization layer: POL

What is claimed is:

1. An optical unit comprising:
a phase difference layer having a λ/4 phase difference value and comprising a UV absorbent, and
a linear polarization layer on the phase difference layer,
wherein the phase difference layer further consists of:
a base film,
a sole liquid crystal layer, and
an overcoat layer on the liquid crystal layer, the liquid crystal layer being between the base film and the overcoat layer, and
an alignment layer between the liquid crystal layer and the base film, wherein the base film has a thickness of 10 nm or less,
wherein the UV absorbent is mixed with a liquid crystal material in the liquid crystal layer, and
wherein an optical axis of the base film and an optical axis of the liquid crystal layer are aligned.

2. The optical unit of claim 1, wherein:
the UV absorbent is on a front surface of the base film.

3. The optical unit of claim 1, wherein the UV absorbent comprises at least one selected from compounds represented by any of Chemical Formulae 1 and 2:

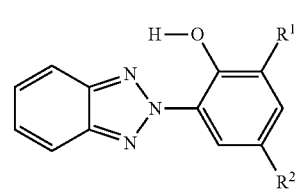

Chemical Formula 1

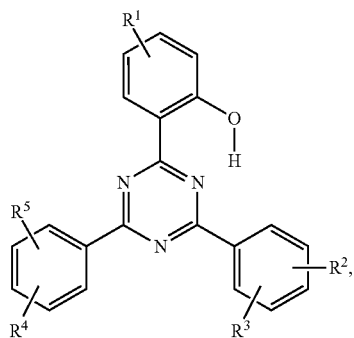

Chemical Formula 2 wherein $R^1$ to $R^5$ are each independently a substituent group or a hydrogen atom, and the substituent group is selected from an alkyl group, a cycloalkyl group, an aryl group, an acylamino group, an alkylthio group, an arylthio group, an alkenyl group, a halogen atom, an alkynyl group, a heterocyclic group, an alkylsulfonyl group, an arylsulfonyl group, an alkylsulfinyl group, an arylsulfinyl group, a phosphono group, an acyl group, a carbamoyl group, a sulfamoyl group, a sulfonamide group, a cyano group, an alkoxy group, an aryloxy group, a heterocyclic oxy group, a siloxy group, an acyloxy group, a sulfonic acid group, a sulfonic acid salt, an aminocarbonyloxy group, an amino group, an anilino group, an imide group, a ureide group, an alkoxycarbonylamino group, an alkoxycarbonyl group, an aryloxycarbonyl group, a heterocyclic thio group, a thioureide group, a carboxyl group, a carboxylic acid salt, a hydroxyl group, a mercapto group, and a nitro group.

4. The optical unit of claim 3, wherein the UV absorbent further comprises a compound represented by Chemical Formula 3:

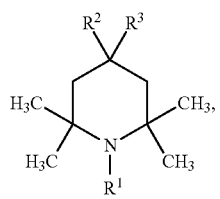

Chemical Formula 3 wherein $R^1$ to $R^3$ are each independently a substituent group or a hydrogen atom, and the substituent group is selected from an alkyl group, a cycloalkyl group, an aryl group, an acylamino group, an alkylthio group, an arylthio group, an alkenyl group, a halogen atom, an alkynyl group, a heterocyclic group, an alkylsulfonyl group, an arylsulfonyl group, an alkylsulfinyl group, an arylsulfinyl group, a phosphono group, an acyl group, a carbamoyl group, a sulfamoyl group, a sulfonamide group, a cyano group, an alkoxy group, an aryloxy group, a heterocyclic oxy group, a siloxy group, an acyloxy group, a sulfonic acid group, a sulfonic acid salt, an aminocarbonyloxy group, an amino group, an anilino group, an imide group, a ureide group, an alkoxycarbonylamino group, an alkoxycarbonyl group, an aryloxycarbonyl group, a heterocyclic thio group, a thioureide group, a carboxyl group, a carboxylic acid salt, a hydroxyl group, a mercapto group, and a nitro group.

* * * * *